US006975252B2

(12) United States Patent
Yamakawa et al.

(10) Patent No.: US 6,975,252 B2
(45) Date of Patent: Dec. 13, 2005

(54) DISK APPARATUS AND DISK REPRODUCING METHOD

(75) Inventors: Hideyuki Yamakawa, Kawasaki (JP); Koichi Otake, Yokohama (JP); Yukiyasu Tatsuzawa, Yokohama (JP); Hiroyuki Moro, Ome (JP); Toshihiko Kaneshige, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/017,233

(22) Filed: Dec. 21, 2004

(65) Prior Publication Data

US 2005/0141385 A1     Jun. 30, 2005

(30) Foreign Application Priority Data

Dec. 26, 2003  (JP)  .............................. 2003-433932

(51) Int. Cl.[7] .......................... H03M 7/00; G11B 5/035
(52) U.S. Cl. ............................. 341/50; 341/59; 341/56; 360/65
(58) Field of Search ............................. 341/50, 56, 59, 341/94, 65; 360/65; 714/795, 792

(56) References Cited

U.S. PATENT DOCUMENTS 4,566,044 A * 1/1986 Langdon et al. .............. 341/56
5,781,130 A * 7/1998 McLaughlin et al. ......... 341/56
5,956,195 A * 9/1999 Brickner et al. .............. 341/59
6,035,435 A * 3/2000 Shih et al. .................... 341/59
6,362,754 B1 * 3/2002 Van Dijk et al. ............. 341/59
6,384,747 B1 * 5/2002 Reed et al. ................... 341/59
6,714,144 B1 * 3/2004 Reed et al. ................... 341/50
2004/0133843 A1   7/2004 Yamakawa

FOREIGN PATENT DOCUMENTS

JP          9-17130        1/1997
JP          2002-344331    11/2002

* cited by examiner

*Primary Examiner*—Lam T. Mai
(74) *Attorney, Agent, or Firm*—Pillsbury Winthrop Shaw Pittman, LLP

(57) ABSTRACT

A disk apparatus has a reading unit which reads reflection light from a disk and outputting a read signal, an identifying unit which identifies whether the read signal has been modified in accordance with a first modulation rule or has been modulated in accordance with a second modulation rule and outputs an identification signal, an equalizing unit which applies a waveform equalizing process to the read signal, and a decoding unit which carries out likelihood decoding of the waveform equalized read signal according to the modulation rule indicated by the identification signal from the identifying unit, and outputs a reproduction signal.

7 Claims, 11 Drawing Sheets

Transition when minimum run length = 1

The numerals in the figure is a(k)/Z(k).

Transition when minimum run length = 2

The numerals in the figure is a(k)/Z(k).

Trellis diagram for minimum run length is 1

Trellis diagram for minimum run length is 2

Trellis diagram for minimum run length is 1

DISK APPARATUS AND DISK REPRODUCING METHOD

CROSS-REFERENCE TO RELATED APPLICATIONS

This application is based upon and claims the benefit of priority from prior Japanese Patent Application No. 2003-433932, filed Dec. 26, 2003, the entire contents of which are incorporated herein by reference.

BACKGROUND OF THE INVENTION

1. Field of the Invention

The present invention relates to a reproducing system process of a disk apparatus, and more particularly, to a disk apparatus and a disk reproducing method for decoding a disk modulated in accordance with a modulation rule of a different minimum run length by means of a single Viterbi decoding unit.

2. Description of the Related Art

As a recording medium and a recording and reproducing apparatus capable of recording and reproducing digital data, there can be exemplified an optical disk represented by a DVD (Digital Versatile Disc). For example, in a DVD-RAM which is one of the DVDs, a signal recording layer is provided on a recording medium. A laser light beam having energy which is proper to this signal recording layer is emitted, thereby changing a crystal state of the recording layer. When a laser light beam with proper energy is emitted again to this recording layer, reflection light of an amount according to a crystal state of the recording layer can be obtained. Recording and reproduction of digital data are carried out by detecting this reflection light. As another optical disk, a DVD-RW, a DVD-R or the like is commercially available.

In addition, in recent years, an optical disk apparatus using blue light laser with a short wave-length has also been commercially available. Although these recording media have a plenty of analogies such as identical disk size, they have great differences in the detailed point of view. It is a common object of these recording media to improve a recording density. Further, in order to improve the recording density, a PRML (Partial Response Maximum Likelihood) technique is used.

Now, a principle of the PRML scheme for use in an optical disk apparatus will be described here. A partial response (PR) is provided as a method for carrying out data compression while a necessary signal bandwidth is compressed by actively utilizing an inter-symbol-interference (interference between reproduction signals which correspond to the adjacently recorded bits). Data can be further classified into a plurality of types and classes depending on how to generate inter-symbol interference. For example, in the case of class 1, reproduction data is reproduced as 2-bit data "11" in response to recording data "1", and inter-symbol interference is generated in response to the succeeding 1 bit. In addition, a Viterbi decoding scheme (ML) is a so called type of a likelihood sequence estimation scheme. This scheme carries out data reproduction based on information on a signal amplitude over a plurality of times by advantageously utilizing a rule on inter-symbol interference possessed by a reproducing waveform. In order to carry out this process, a synchronizing clock synchronized with a reproducing waveform obtained from a recording medium is generated, the reproducing waveform itself is sampled by means of this clock, and the sampled waveform is converted into amplitude information. Then, the amplitude information is converted into a response waveform of a predetermined partial response by carrying out proper waveform equalization. Further, the past and current sample data are used at a Viterbi decoding unit, and the most probable data sequence is outputted as reproduction data. A scheme obtained by combining the above partial response scheme and Viterbi decoding scheme (Maximum Likelihood decoding) is referred to as a PRML scheme.

In the partial response, a reproduction signal sequence can be calculated by making convolution computation of an impulse response of a predetermined partial response class for a recording data sequence. That is, a process from recording to reproduction can be expressed as an arbitrary finite state machine having an N state (in which $N=2^{m-1}$ is obtained when a response length of a predetermined partial response is defined as "m"). A two-dimensional graph for expressing (N) of time "k" at which this finite state is present by nodes arranged in a vertical direction, and expressing a transition from each state to each state of time (k+1) as a branch is referred to as a trellis diagram. A Viterbi algorithm is used to obtain a reproduced signal sequence from a reproduction signal sequence, i.e., to make a search for the shortest pass on this trellis diagram. This algorithm is equivalent to a dynamic programming problem to a multi-stepped decision process. A Viterbi decoder based on this algorithm is used to make likelihood estimation of a transmission sequence in a channel having inter-symbol interference and a bandwidth restriction. That is, from among a possible code sequence, for example, a code sequence for minimizing a distance metric (distance function) relating to a sequence of a receive signal such as a sum of a square error in a sequence of the receive signal is selected. In order to use this PRML technique in practice, there is a need for an adaptive equalization technique with high precision and a timing recovery technique with high precision so that a reproduction signal is produced as a response of a predetermined partial response class.

Now, a Run Length Limited (RLL) code for use in the PRML technique will be described here. In a PRML reproducing system, from a signal itself reproduced from a recording medium, a clock synchronized with the reproduced signal is generated. In order to generate a stable clock, it is necessary that the reproduced signal is inverted in polarity within a predetermined time interval. At the same time, in order to reduce a maximum frequency of the reproduced signal, the polarity of the reproduced signal is prevented from being inverted within a predetermined time interval. Here, a maximum data length in which the polarity of the reproduced signal is not inverted is referred to as a maximum run length, and a minimum data length in which the polarity is not inverted is referred to as a minimum run length. A modulation rule in which the maximum run length is 8 bits and the minimum run length is 2 bits is referred to as (1,7)RLL. A modulation rule in which the maximum run length is 8 bits and the minimum run length is 3 bits is referred to as (2,7)RLL. As a typical modulation and demodulation scheme for use in an optical disk, there can be exemplified (1,7)RLL or an EFM plus.

In patent document (Jpn. Pat. Appln. KOKAI Publication No. 2002-344331), an example of a Viterbi decoder circuit is disclosed. With this configuration, for example, reproduction of a DVD-RAM or the like using the (2,10)RLL modulation rule can be carried out.

However, in a prior art of patent document 1, its Run Length Limited is obtained as (2,10)RLL. In the near future, there is a demand for an optical disk apparatus which is compatible with an optical disk medium recorded in accordance with the (1,7)RLL rule. In this apparatus, it is predicted that there is a need for enabling reproduction of a conventional disk medium recorded in accordance with the (2,10) or (2,7)RLL rule. With this configuration, there is a problem that reproduction between a next generation DVD and a current DVD cannot be shared. Furthermore, apart from the (2,10) or (2,7) RLL rule, even if a Viterbi decoder for reproduction of an optical disk medium recorded in the (1,7)RLL rule, there is a problem that remarkable reduction of an area or cost reduction cannot be achieved structurally.

BRIEF SUMMARY OF THE INVENTION

An embodiment of the present invention is a disk apparatus comprising a reading unit which reads reflection light from a disk and outputting a read signal; an identifying unit which identifies whether the read signal has been modified in accordance with a first modulation rule or has been modulated in accordance with a second modulation rule and outputs an identification signal; and a decoding unit which carries out likelihood decoding of the waveform equalized read signal according to the modulation rule indicated by the identification signal from the identifying unit, and outputs a reproduction signal.

DETAILED DESCRIPTION OF THE INVENTION

Hereinafter, preferred embodiments of the present invention will be described with reference to the accompanying drawings.

Configuration and Operation of Optical Disk Apparatus (Basic Configuration and Basic Operation)

Figure 1:
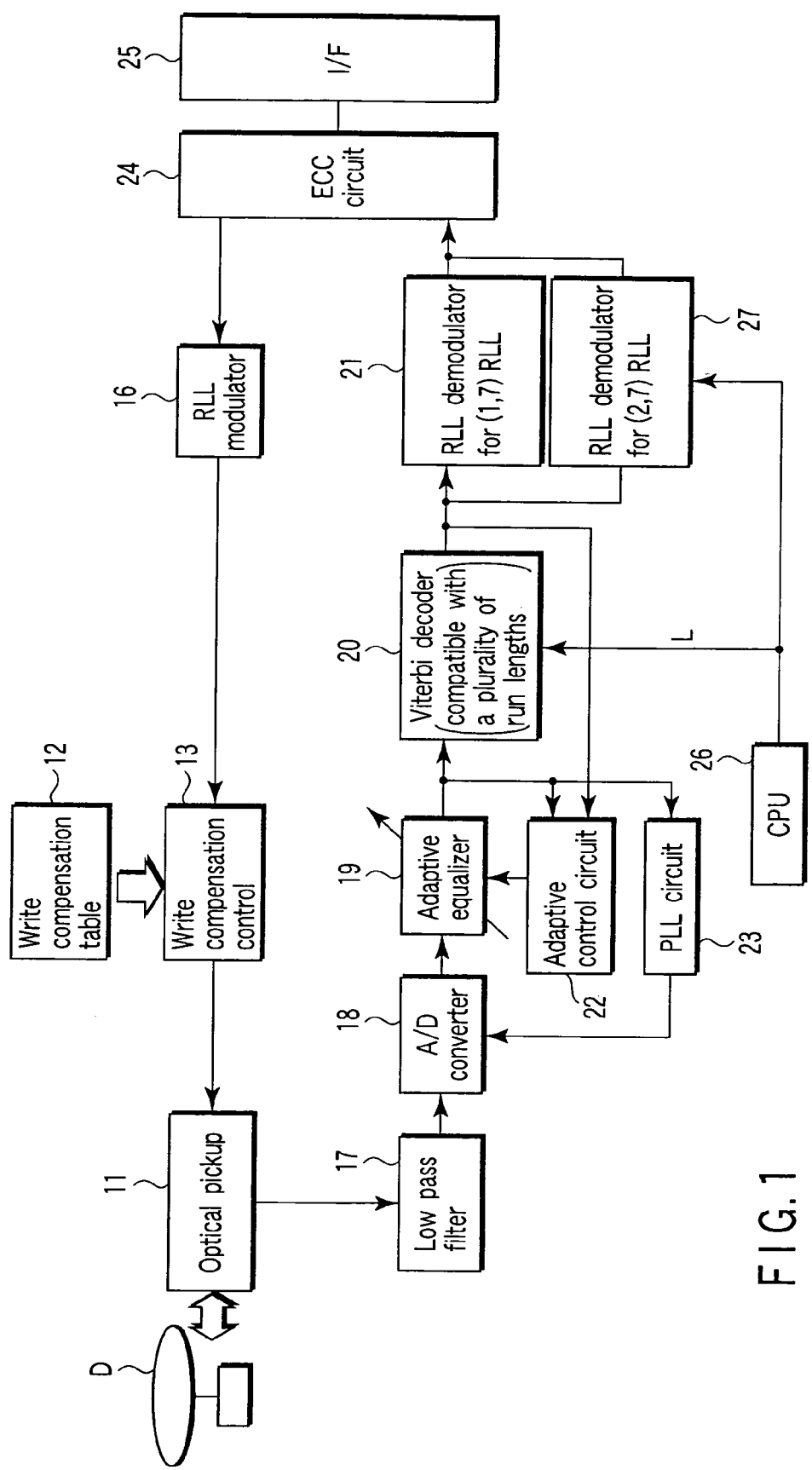
FIG. 1 is a block diagram depicting an example of a configuration of a disk apparatus according to the present invention.

FIG. 1 shows an example of a configuration of a general recording and reproducing circuit of an optical disk apparatus. The optical disk apparatus according to the present invention, as shown in FIG. 1, has: an optical pickup 11 for emitting a laser light beam to an optical disk D, receiving reflection light, and outputting a read signal; a write-compensation table 12 for providing setting information for data recording; a write-compensation control unit 13 for making write-compensation control during data recording; an RLL modulator 16 for carrying out a predetermined RLL modulation for recording data; and an ECC circuit 24 connected to an interface 25, the ECC circuit carrying out error correction. Further, the optical disk apparatus according to the invention has: a low pass filter 17 connected to the optical pickup 11, the low pass filter applying filter processing to the read signal; an A/D converter 18 for A/D converting the signal; an adaptive equalizer 19 for applying equalization processing of a waveform equalization process to the A/D converted signal; a Viterbi decoder 20 for carrying out likelihood decoding of the waveform equalized data; an RLL demodulator 21 for carrying out (1,7)RLL demodulation for the demodulated signal; an RLL decoder 26 for carrying out (2,7)RLL demodulation; an adaptive control circuit 22 for optimizing a tap coefficient of the adaptive equalizer based on a Viterbi decoded signal; a PLL circuit 23; and a CPU 26 for controlling a whole operation.

Hereinafter, a circuit operation will be described here together with an operation during recording and reproduction in the recording and reproducing circuit. The RLL modulator 16 modulates recording data so as to meet a predetermined (1,7)RLL or (2,7)RLL. The write-compensation control unit 13 generates a write pulse with a proper timing with reference to the write-compensation table 12 in response to each individual run length of the write data generated by the RLL modulator 16. The write pulse generated by the write-compensation control unit 13 is produced as an optical signal by means of the optical pickup 11, and is emitted to the optical disk D. On the optical disk D, a crystal state of the recording layer changes according to the intensity of the emitted light beam. A sequence of operations during data recording has now been completed.

Now, an operation during data reproduction will be described here. The optical pickup 11 emits a laser light beam with proper intensity to the optical disk D. As a result of emission of this laser light beam, the reflection light with proper intensity according to the recording data is reflected from the optical disk D. The optical pickup 11 detects this reflection light, and outputs an electrical signal according to the light quantity of the reflection light. This electrical signal is subjected to proper bandwidth restriction in the low pass filter 17. An output signal of the low pass filter 17 is converted into a digital signal in the A/D converter 17. An output signal of the A/D converter 18 is equalized to a desired waveform according to a target partial response class by means of the adaptive equalizer 19. At this time, the equalization characteristic is adjusted by the adaptive training circuit 22. An output of the adaptive equalizer 19 is determined as data "1" or "0" by the Viterbi decoder 20, and is produced as binary data. As the produced binary data, one of the RLL demodulator 21 for carrying out (1,7)RLL demodulation and the RLL demodulator 26 for carrying out (2,7)RLL demodulation, according to a minimum run length selected signal L received from the CPU 26, is selected, whereby reverse processing (demodulation) of the RLL modulation is carried out, and the recorded data can be produced. At the same time when these operations are made, the PLL circuit 23 makes control of a sampling clock so that a sampling timing at the A/D converter 18 becomes proper in accordance with an output of the adaptive equalizer 19.

(Viterbi Decoder)

Now, with reference to the accompanying drawings, a detailed description will be given with respect to a Viterbi decoder for decoding a disk modulated in accordance with a modulation rule in a minimum run length is "1" and a disk modulated in accordance with a modulation rule in which a minimum run length is "2", which is a feature of the present invention.

Figure 2:
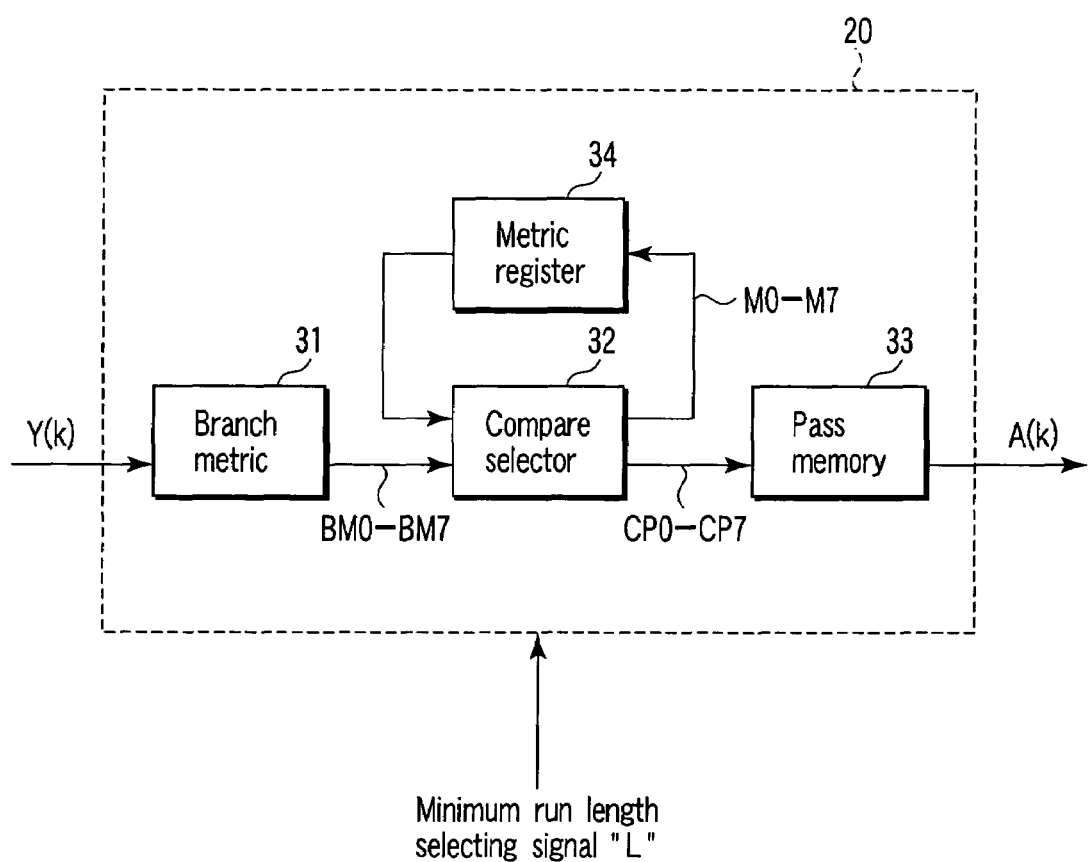
FIG. 2 is a block diagram depicting an example of configuration of a Viterbi decoder which the disk apparatus according to the invention has.

FIG. 2 shows an internal configuration of the Viterbi decoder 20 according to the present invention. The Viterbi decoder 20 has: a branch metric computing device 31 for carrying out computation of a branch metric; a compare selector 32 for carrying out addition, comparison, and selection of a metric value; a metric register 34 for storing the selected metric value; and a pass memory 33 for storing a selection result of the compare selector 32 and outputting final reproduction data.

That is, the Viterbi decoder 20 is composed of four main functions, a function (BM: Branch Metric computing device 31) for carrying out computation of a branch metric shown in Formula (5) described later; a function (compare selector 32) for carrying out addition, comparison, and selection of a metric value shown in Formula (4) described later; a function (MR: Metric Register 34) for storing the selected metric value; and a function (PM: Pass Memory 33) for storing the selection result of Formula (4) and output final reproduction data.

The Viterbi decoder 20 according to the invention first determines which minimum run length has been used to modulate a disk in order to reproduce a disk modulated in accordance with a modulation rule in which a minimum run length is "1" and a disk modulated in accordance with a modulation rule in which a minimum run length is "2". Then, based on an identification signal or the like of this disk type, when a read signal is decoded by the Viterbi decoder, a value of probability of a data sequence according to the modulation rule in which the minimum run length is "1" is obtained by the branch metric section 31. Then, this value is compared by the compare selector 32, and the most probable data sequence is outputted as a reproduction signal.

In addition, based on the identification signal or the like of this disk type, if it is determined that the disk has been modulated in accordance with the modulation rule in which the minimum run length is "2", the compare selector 32 eliminates a value of the probability of the data sequence used only when the maximum run length is "1" by working of switches 61 and 62 described later. Then, this compare selector compares only a value of the probability of the data sequence in accordance with the modulation rule in which the maximum run length is "2", and stores the comparison result in the metric resistor 34. By continuing such processing, a data sequence of the most probable value is finally selected in the pass memory 33, and the selected data sequence is outputted to the external RLL demodulator 21 or the like. In the following description, in the case where the minimum run length is "1", the (1,7)RLL rule is followed; and in the case where the minimum run length is "2", the (2,7)RLL rule is followed. Here, even if the maximum run length is different from the foregoing modulation side, no change can occur with the essential of the present invention.

(Compare Selector)

Figure 3:
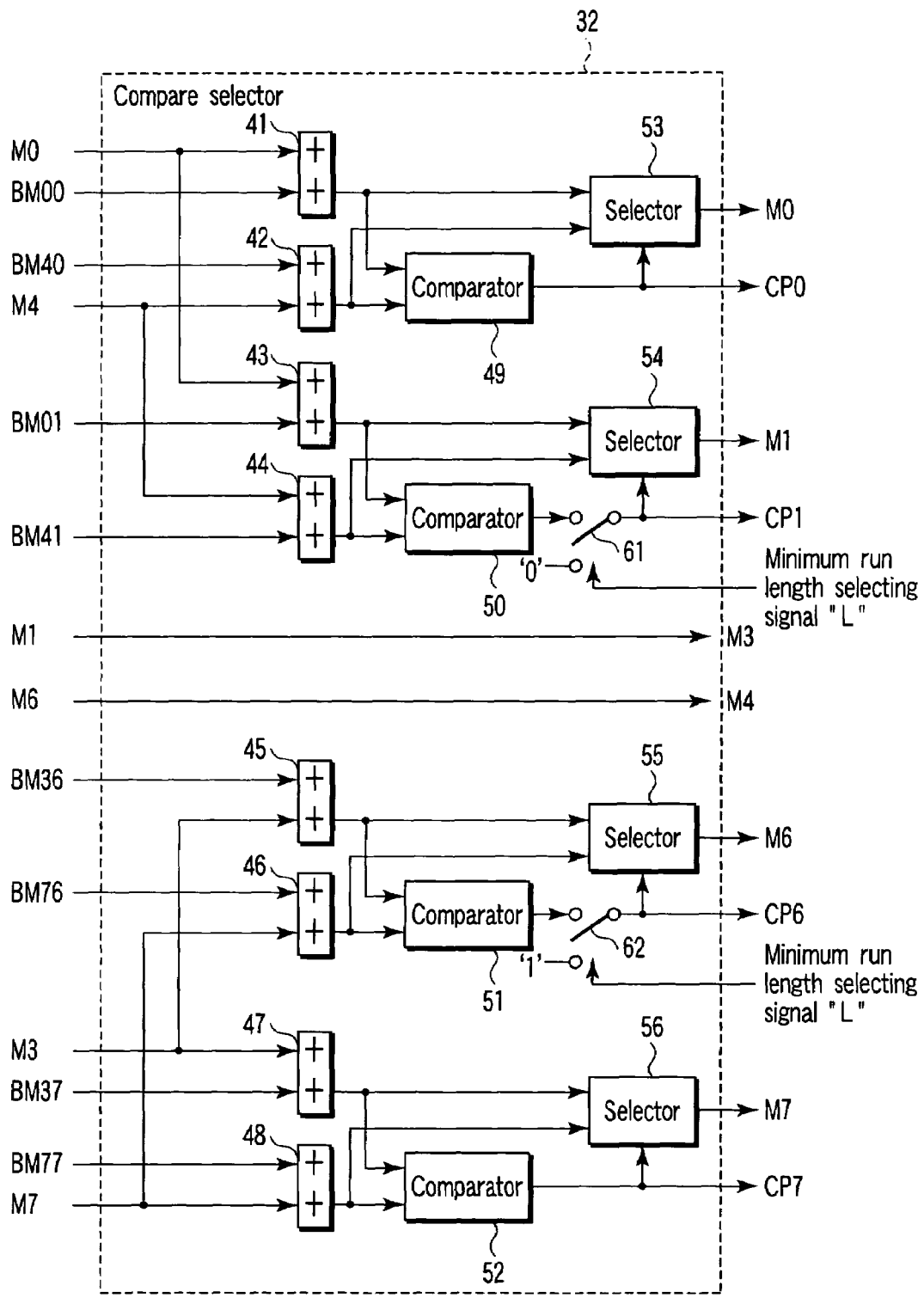
FIG. 3 is a block diagram depicting an example of a configuration of a compare selector which the Viterbi decoder of the disk apparatus according to the invention has.

FIG. 3 is a block diagram depicting a configuration of a compare selector according to the present invention. In FIG. 3, BM00, BM49, BM01, BM41, BM36, BM76, BM37, and BM77 are obtained as values of branch metric shown in Formula (6) described later, and are obtained as output signals of the branch metric computing device 31. M0, M1, M3, M4, M6, and M7 are obtained as metric values, and are obtained as output signals of the metric register 34. In addition, adder circuits 41 to 138 each output a sum of two input values. A terminal at the left side in the figure is an input value, and a terminal at the right side in the figure is an output. Computation in these adder circuit is carried out as an add process shown in Formula (4) described later. Further, comparator circuits 49, 50, 51, and 52 carry out a scale comparison between input values of two right side terminals. In the case where the upper input value of each comparator is smaller than the lower input value, "0" is outputted. In the other cases, "1" is outputted. These comparator circuits 49, 50, 51, and 52 each carry out a comparing process shown in Formula (4) described later. In addition, selector circuit codes 143 to 146 each output either of the two left side input values based on the comparison result of the comparator circuits 49 to 52. In the case where outputs of the comparator circuits 49, 50, 51, and 52 are "0", the upper input value of each selector is outputted. In the case where outputs of the comparator circuits 49, 50, 51, and 52 are "1", the lower input value of each selector is outputted. The selected value is connected to the metric register 34, and is used as a metric value at a next time. The outputs of the comparator circuits 49, 50, 51, and 52 are connected to the pass memory 33.

The switch 61 switches whether to set an input signal to a selection input terminal of a selector 54 at an output of the comparator 50 or a fixed value "0". In the case where the (1,7)RLL rule is followed, the output of the comparator 50 and the selection input terminal of the selector 54 are set so as to be connected to each other. In the case where the (2,7)RLL rule is followed, the selection input terminal of the selector 54 is connected so as to be always "0".

The switch 62 switches whether to set an input signal to a selection input terminal of a selector 55 at an output of the comparator 51 or a fixed value. In the case where the (1,7)RLL rule is followed, the output of the comparator 51 and the selection input terminal of the selector 55 are set so as to be connected to each other. In the case where the (2,7)RLL rule is followed, the selection input terminal of the selector 55 is connected so as to be always "0".

With the above configuration, the compare selector 32 compatible with either of the cases of the (1,7)RLL and (2,7)RLL can be provided. With respect to the other constituent elements of the Viterbi decoder 20, the same configuration may be provided in either of the cases of (1,7)RLL and (2,7)RLL.

(Configuration of Metric Register)

Figure 4:
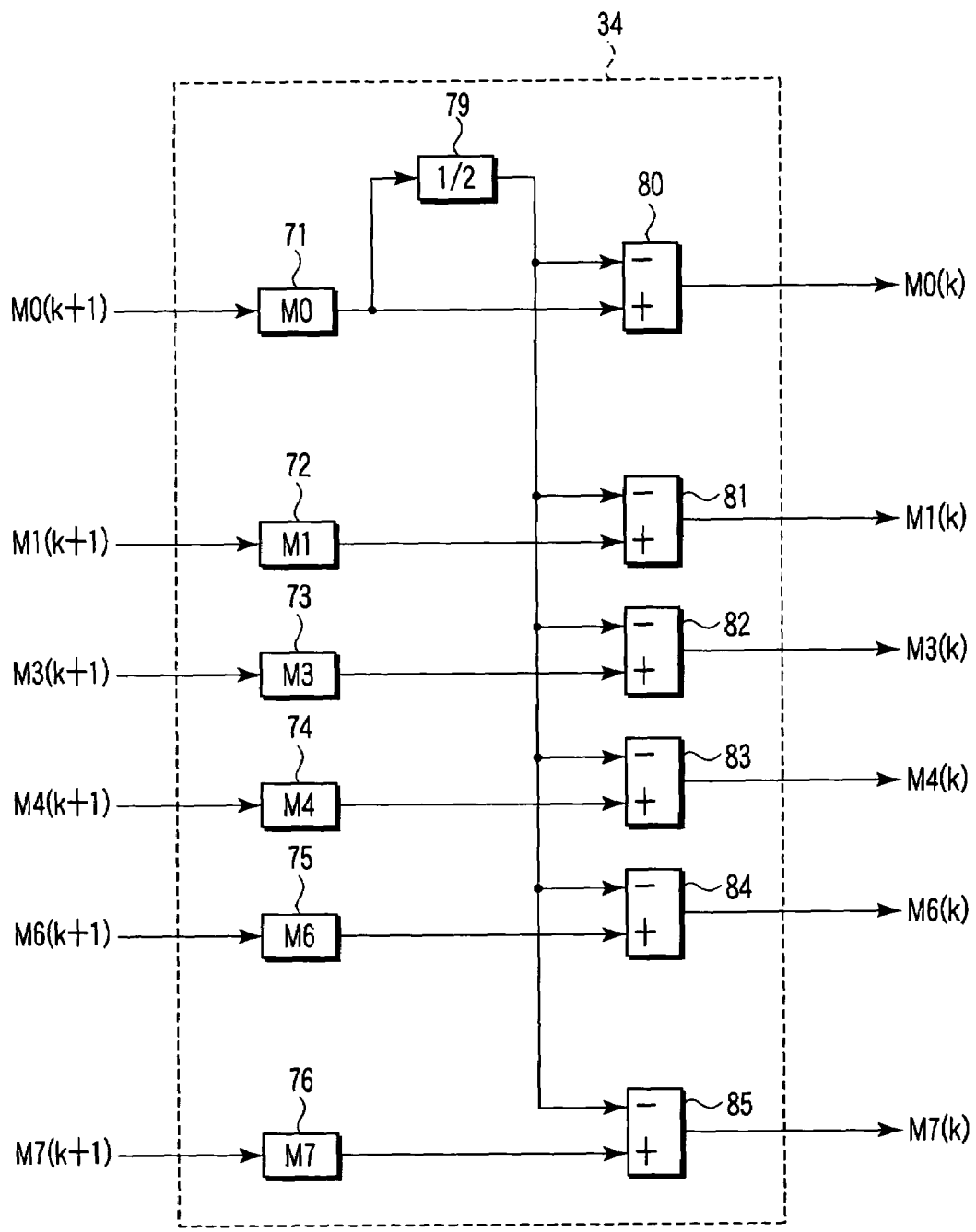
FIG. 4 is a block diagram depicting an example of a configuration of a metric register which the Viterbi decoder of the disk apparatus according to the invention has.

Now, a configuration of the metric register 34 will be described here. The metric register 34 retrains a minimum metric value obtained by each time. This metric value is utilized for a comparing and/or selecting process at a next time. At the same time, a process for avoiding an overflow of the metric value is carried out. FIG. 4 is a view showing an example of a configuration of the metric register 34. As shown in FIG. 4, the metric register 34 comprises flip flops 71 to 76, a shift circuit 79, and adder circuits 60 to 85. The flip flops 71 to 76 produce as input signals the metric values M0(k+1), M1(k+1), M3(k+1), M4(k+1), M6(k+1), and M7(k+1) obtained by the compare selector 32 in each time, and retains these values. The shift circuit 79 obtains a value which is ½ of the value retained by the flip flop 71. The adder circuits 80 to 85 subtract an output value of the shift circuit 79 from the values retained by the flip flops 71 to 776, and sets a new metric value, thereby preventing an overflow of the metric value. Outputs of the adder circuits 80 to 85 are produced as the current metric values M0(k), M1(k), M3(k), M4(k), M6(k), and M7(k), and are produced as inputs of the compare selector 32.

(Configuration of Pass Memory)

Figure 5:
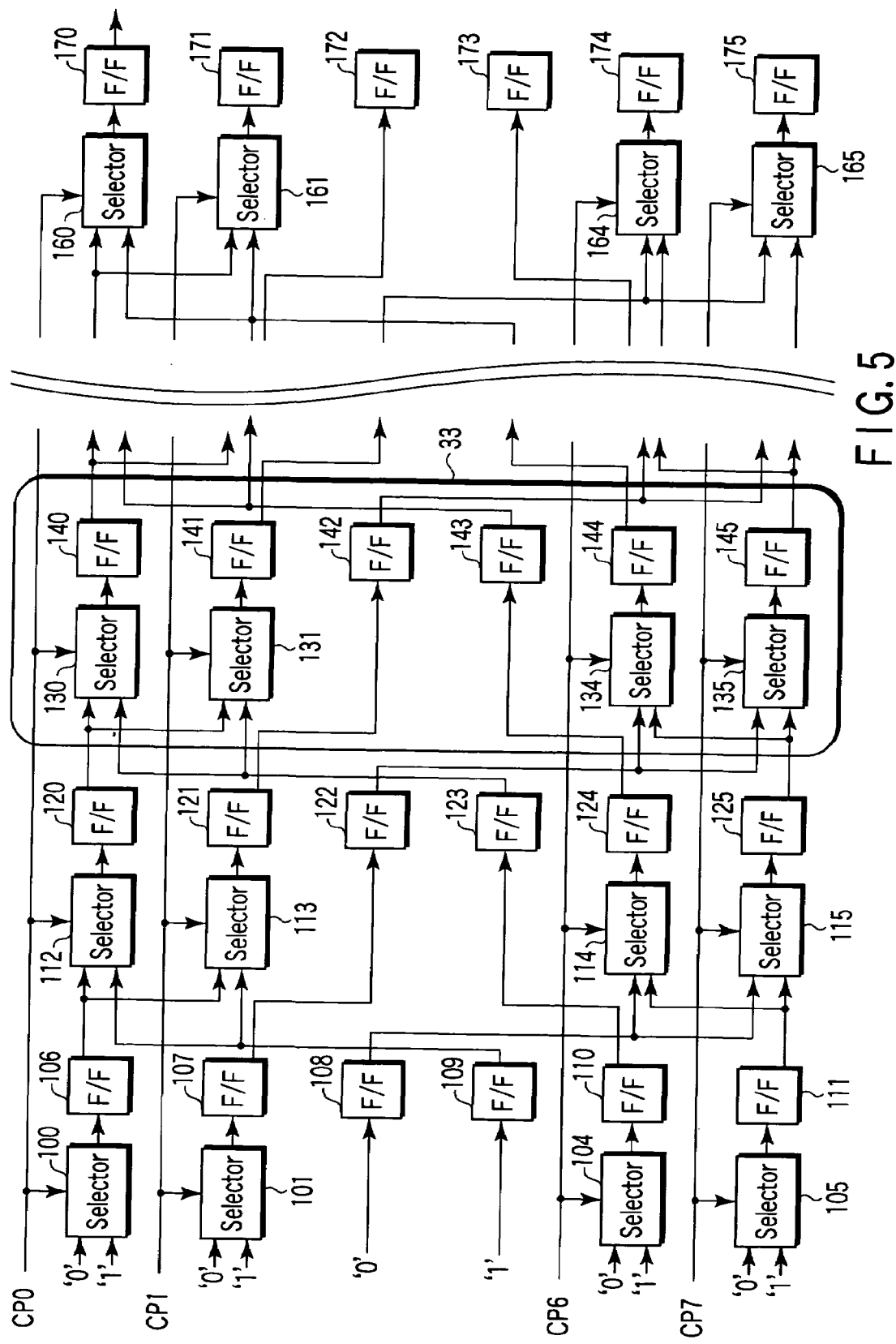
FIG. 5 is a block diagram depicting an example of a configuration of a pass memory which the Viterbi decoder of the disk apparatus according to the invention has.

Now, a configuration of the pass memory 33 will be described with reference to FIG. 5. In the figure, selectors 100 to 105 and 112 to 115 each select either one of the two inputs at the left side in the figure, and outputs it from the right side terminal. The selected and outputted signal is produced as a terminal at the upper side in the figure. When the selected signal is "0", the upper side of the input signal is selected. When the selected signal is "1", the lower side of the input signal is selected. In addition, the flip flops 106 to 111 captures a signal of the right side input terminal by an input of a clock, although not shown, and outputs the value until a next clock input has been made.

One unit of the pass memory 33 enclosed by the solid line in the figure is connected in predetermined plurality at the blanked portion indicated by the dashed line. CP0 from the compare selector 32 is connected to a selected signal input terminal of each of the selectors 130 to 135. CP1 from the compare selector 32 is connected to a selected signal input terminal of each of the selectors 101, 111, 131, and 161. CP6 from the compare selector 32 is connected to a selected signal input terminal of each of the selectors 104, 114, 134, and 164. CP7 from the compare selector 32 is connected to a selected signal input terminal of each of the selectors 105, 115, 135, and 165.

In such connections, if the metric selection result CP0, CP1, CP6, or CP7 is inputted for each time, the past selection results are sequentially shifted. Then, a final determination result is outputted from at east one of the flip flops 106 to 111, 120 to 125, 140 to 145, and 170 to 175, and is outputted to the RLL demodulator 21.

(Viterbi Algorithm)

Now, an operation of such the Viterbi decoder will be described with reference to a Viterbi algorithm, a state transition diagram, and a trellis diagram.

Figure 6:
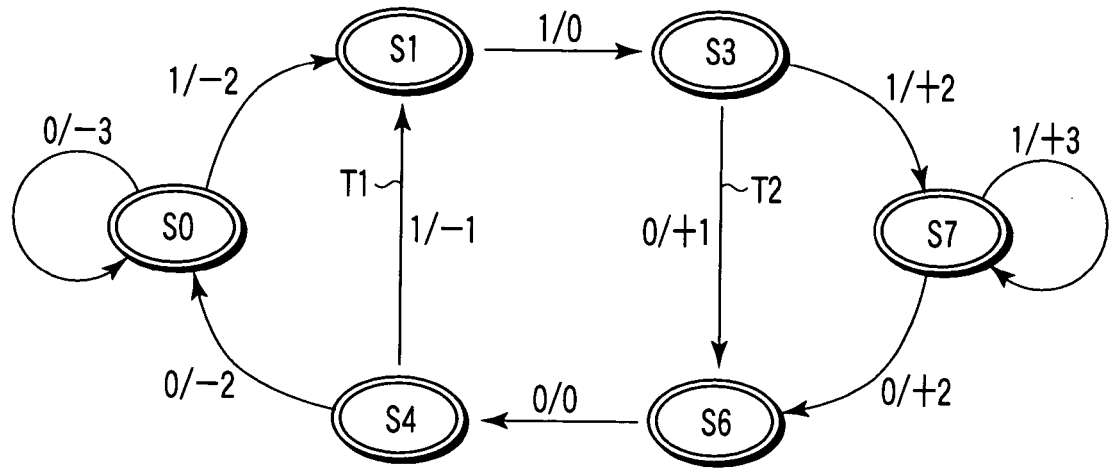
FIG. 6 is a state transition diagram corresponding to (1,7)RLL and PR(1221), which shows a process of the Viterbi decoder of the disk apparatus according to the invention.

FIG. 6 is a state transition diagram showing a case in which a partial response class is (1221) and a (1,7)RLL code is used, i.e., the minimum run length is "1". In the case where the (1,7)RLL code is used in PR(1221), the number of internal states becomes 6. The internal states are defined as S0, S1, S3, S4, S6, and S7, respectively. In addition, an ideal channel output amplitude value is defined as {−3, −2, −1, 0, 1, 2, 3}, and an ideal channel output amplitude at a time "k" is defined as Z(k). In addition, a recording code at a time "k" is defined as a(k). i.e., the defined value is either a(k)="0" or "1". The following formula is established from a principle of partial response.

$$Z(k)=\{a(k)*1+a(k-1)*2+a(k-2)*2+a(k-3)*1\}-\{1+2+2+1\}/2 \quad (1)$$

The final term "−(1+2+2+1)/2" in Formula (1) is defined so that a direct current component of a reproduced waveform after equalized becomes zero.

In addition, an actual channel output including a medium noise or the like is defined as Y(k). With respect to Y(k) and Z(k), the following relationship is met:

$$Y(k)=Z(k)+n(k) \quad (2)$$

wherein n(k) denotes a noise component included in a channel output at a time (k).

In FIG. 6, a state at a time "k" is assumed to have been S0. Here, if a recording code at a time "k" is a(k)="0", Z(k)=−3 is outputted, and a state at a next time (k+1) becomes S0. In addition, a recording code at a time "k" is a(k)="1" Z(k)=−2 is outputted, and a state at a next time (k+1) becomes S1. Similarly, a state at a time "k" is assumed to have been S1. Here, if a recording code at a time "k" is a(k)="1", Z(k)=0 is outputted, and a state at a next time (k+1) becomes S3. In the case where a state at a time "k" has been S1, a branch of a(k)="0" does not occur from a limitation on the (1,7)RLL code. Similarly, a state at a time "k" is assumed to have been S3. Here, if a recording code at a next time (k+1) is (k)="1", Z(k)=+2 is outputted, and a state at a next time (k+1) becomes S7. In addition, a recording code at a time "k" is a(k)="0", Z(k)=+1 is outputted, and a state at a next time (k+1) becomes S6. Similarly, a state at a time "k" is assumed to have been S7. Here, if a recording code at a time is a(k)="1", Z(k)=+3 is outputted, and a state at a next time (k+1) becomes S7. In addition, a recording code at a time "k" is a(k)="0", Z(k)=+2 is outputted, and a state at a next time (k+1) becomes S6. Similarly, a state at a time "k" is assumed to have been S6. Here, if a recording code at a time "k" is a(k)="0", Z(k)=0 is outputted, and a state at a next time (k+1) becomes S4. In the case where a state at a time "k" has been S6, a blanch of a(k)="1" does not occur from a limitation on the (1,7)RLL code. Similarly, a state at a time "k" assumed to have been S4. Here, if a recording code at a time "k" is a(k)= "0", Z(k)=−2 is outputted, and a state at a next time (k+1) becomes S0. In addition, if a recording code at a time "k" is a(k)="1", Z(k)=−1 is outputted, and a state at a next time (k+1) becomes S1. Thus, an output Z(k) and state S(k+1) at a next time are determined from a new input a(k) and state S(k) at that time.

It should be noted that, in FIG. 6, a transition T1 and a transition T2 occur only when a modulation rule in which a minimum run length is "1" is followed and does not occur when a modulation rule in which a minimum run length is "2", is followed.

In the Viterbi algorithm, a value indicating probability of a data sequence referred to as a metric is defined, and a data sequence having the most probable metric value is defined as reproduction data. Here, a metric value is computed with respect to each data sequence by working of the branch metric 31. Although there are several definitions of the metric value, in general, a definition using a square error is widely used. A branch metric Mx reaching state Sx at a time "k" is defined in accordance with the following formula.

$$Mxy=(Y(k)-Zxy(k))^2 \quad (3)$$

Mxy in Formula (3) is a value which is determined by obtaining Z(k) with respect to a state transition in which a state at a time "k" changes from Sx to Sy, and obtaining a square of an error of an actual channel output Y(k) at each time. Next, all sequences of a(k) reaching state Sx at a time "k" are obtained, and a sum of branch metrics with respect to each individual sequence of a(k) is obtained. a(k) sequence in which a sum of the obtained branch metrics is obtained a minimum value, is defined as a likelihood sequence. Here, as described previously, an ideal channel output Z(k) at a time "k" can be obtained by a current state S(k) and a current input a(k) only. When a sum of metrics reaching state Sx at a time "k" is assumed to be Mx, a minimum metric at a time "k+1" is obtained by the formula below.

$$M0(k+1) = \text{Min } \{M0(k)+BM00, M4(k)+BM40\}$$

$$M1(k+1) = \text{Min } \{M0(k)+BM01, M4(k)+BM41\}$$

$$M3(k+1) = M1(k)+BM13$$

$$M4(k+1) = M6(k)+BM64$$

$$M6(k+1) = \text{Min}\{M3(k)+BM37, M7(k)+BM77\}$$

$$M7(k+1) = \text{Min}\{M3(k)+BM37, M7(k)+BM77\} \quad (4)$$

In Formula (4), BMxy denotes a branch metric when a transition from a state "x" to a state "y" occurs. According to Formula (3) and FIG. 6, the respective value is obtained as follows.

$$BM00 = \{Y(k)-(-3)\}^2$$

$$BM01 = \{Y(k)-(-2)\}^2$$

$$BM13 = \{Y(k)-(0)\}^2$$

$$BM36 = \{Y(k)-(+1)\}^2$$

$$BM37 = \{Y(k)-(+2)\}^2$$

$$BM40 = \{Y(k)-(-2)\}^2$$

$$BM41 = \{Y(k)-(-1)\}^2$$

$$BM64 = \{Y(k)-(0)\}^2$$

$$BM76 = \{Y(k)-(+2)\}^2$$

$$BM77 = \{Y(k)-(+3)\}^2 \quad (5)$$

Here, in order to select a state transition in which a minimum metric in Formula (4) is obtained, only a scale relationship between sums of the metric values is important, and an absolute value of the metric value is not important. Therefore, even if the same value is added to all the branch metrics of Formula (5), no change occurs with the scale relationship. Then, Formula (5) can be rewritten as follows.

$$BM00 = 6*Y(k)+9$$

$$BM01 = 4*Y(k)+4$$

$$BM13 = 0$$

$$BM36 = -2*Y(k)+1$$

$$BM37 = -4*Y(k)+4$$

$$BM40 = 4*Y(k)+4$$

$$BM41 = 2*Y(k)+1$$

$$BM64 = 0$$

$$BM76 = -4*Y(k)+4$$

$$BM77 = -6*Y(k)+9 \quad (6)$$

In addition, a selection result of a minimum metric in M0, M1, M6, and M7 of Formula (4) is stored in a memory, whereby the histories of state transitions reaching minimum metrics are finally merged, and the merged history is established as likelihood data.

Figure 7:
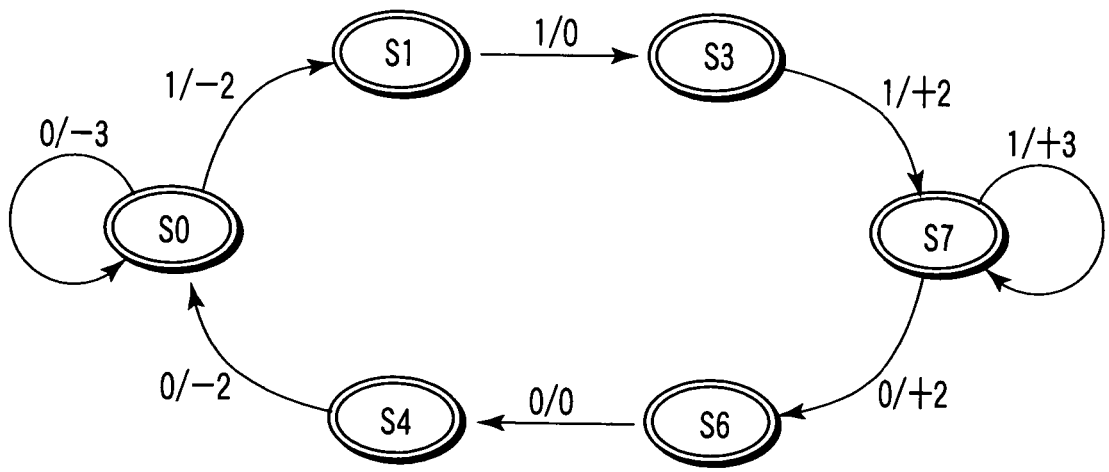
FIG. 7 is a state transition diagram corresponding to (2,7)RLL and PR(1221), which shows a process of the Viterbi decoder of the disk apparatus according to the invention.

FIG. 7 is a state transition diagram in response to (2,7) RLL+PR(1221). A difference from a case of (1,7)RLL in FIG. 6 is that a transition T1 from state S4 to state S1 and a transition T2 from state S3 to state S6 do not exist.

(Trellis Diagram)

Figure 8:
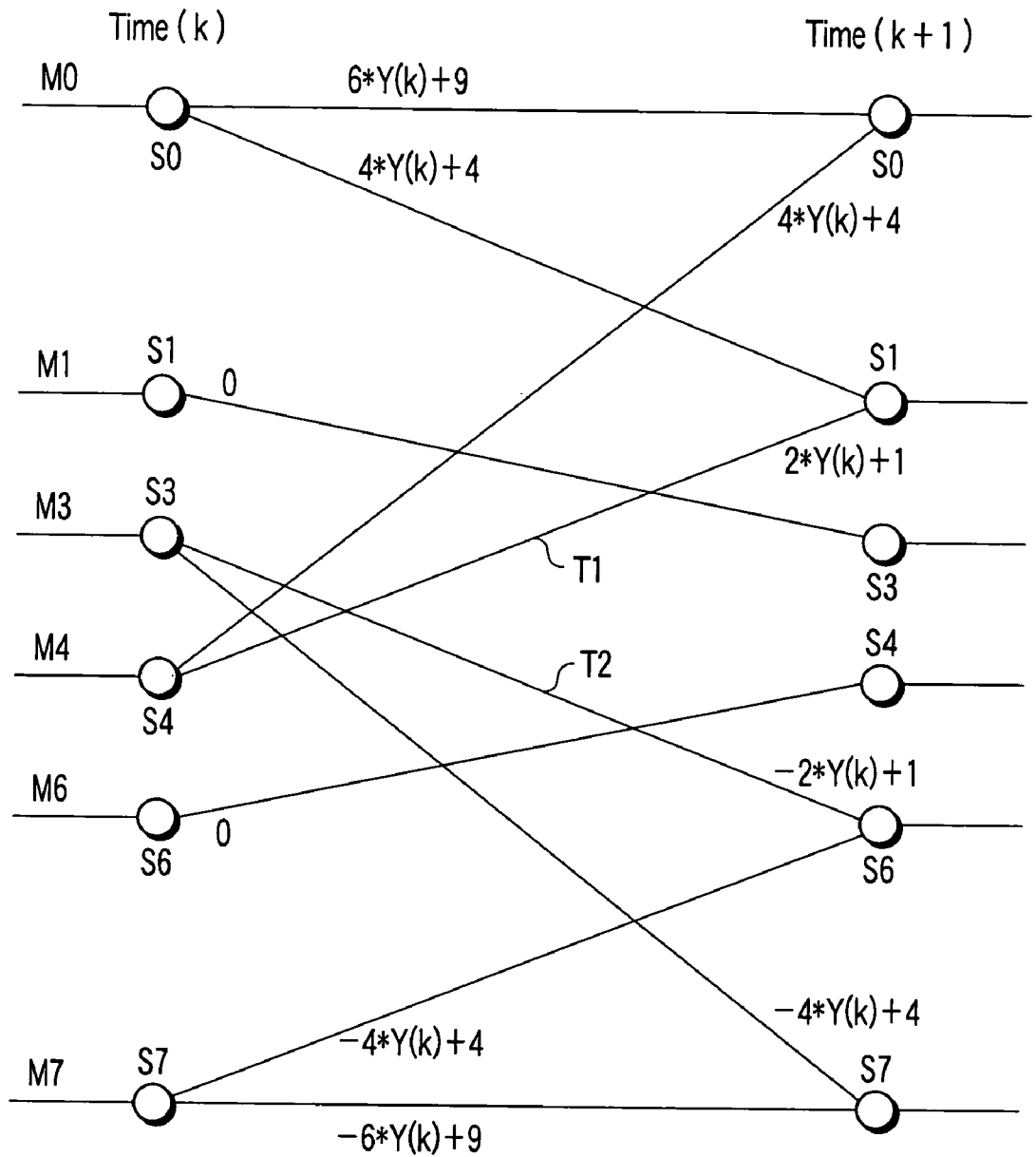
FIG. 8 is a trellis diagram corresponding to (1,7)RLL and PR(1221), which shows a process of the Viterbi decoder of the disk apparatus according to the invention.

FIG. 8 is a trellis diagram showing a state transition of FIG. 6 in a time sequence. In FIG. 8, S0, S1, S3, S4, S6, and S7 indicate states. In addition, a metric of a pass reaching state S0 at a time "k" is defined as M0; a metric of a pass reaching state S1 is defined as M1; a metric of a pass reaching state S3 is defined as M3; a metric of a pass reaching state S4 is defined as M4; a metric of a pass reaching state S6 is defined as M6; and a metric of a pass reaching state S7 is defined as M7. As shown in FIG. 6, in a transition from a time "k" to a time "k+1", state S0 branches into states S0 and S1; state S4 branches to states S0 and S1; state S6 reaches state S4; and state S7 branches into states S6 and S7. A formula on the solid line connecting a state transition from a time "k" to a time "k+1" is a branch metric shown in Formula (6).

In FIG. 8, passes reaching state S0 at a time "k+1" are two transitions, i.e., a transition from state S0 at a time "k" and a transition from state S4 at a time "k". The probabilities from these two pass M0+6*Y(k)+9, M4+4+Y(k)+4 which are results obtained by adding probabilities (branch metrics) of the respective transition paths to metrics M0 and M4 which are probabilities at a time "k". A smaller value obtained by comparing both of these probabilities is produced as a metric M0 of state S0 at a time (k+1).

Similarly, passes reaching state S1 at a time "k+1" are two transitions, i.e., a transition from state S0 at a time "k" and a transition from state S4 at a time "k". The probabilities of these two passes are obtained as M0+4*Y(k)+4 and M4+2*Y(k)+1 which are results obtained by adding probabilities (branch metrics) of the respective transition paths to metrics M0 and M4 which are probabilities at a time "k", respectively. A smaller value obtained by comparing both of these probabilities is produced as a metric M0 of state S0 at a time (k+1).

Similarly, a pass reaching state S3 at a time "k+1" is only a transition from state S1 at a time "k". Therefore, a metric M3 at a time "k+1" is M1+1 obtained by adding to M1 a branch metric of a transition from state S1 to state S3.

Similarly, a pass reaching state S4 at a time "k+1" is only a transition from state S6 at a time "k". Therefore, a metric M3 at a time "k+1" is M1+0 obtained by adding to M1 a branch metric of a transition from state S1 to state S3.

Similarly, passes reaching state S6 at a time "k+1" are two transitions, i.e., a transition from state S3 at a time "k" and a transition from state S7 at a time "k". The probabilities of these two passes are obtained M3−2*Y(k)+1 and M7−4*Y (k)+4 which are results obtained by adding the probabilities of the respective transition paths to metrics M3 and M7 which are probabilities at a time "k", respectively. A smaller value obtained by comparing both of these probabilities is produced as a metric M6 of state S6 at a time (k+1).

Similarly, passes reaching state S7 at a time "k+1" are two transitions, i.e., a transition from state S3 at a time "k" and a transition from state S7 at a time "k". The probabilities of these two passes are obtained as M3−4*Y(k)+4 and M7−6*Y(k)+6 which are results obtained by adding the probabilities of the respective transition paths to metrics M3 and M7 which are probabilities of a time "k", respectively. A smaller value obtained by comparing both of these probabilities is produced as a metric M7 of state S7 at a time (k+1).

When the contents of computation in the branch metric 31, the compare selector 32, and the metric register 34 at each of the above times are summarized with respect to a case reaching state S0, they can be classified into three steps below.

(1) Addition (Add)

$$M0(k)+6*Y(k)+9$$

$$M4(k)+4*Y(k)+4$$

These two computations are independent of each other, and can be carried out in parallel.

(2) Comparison (Compare)

$$M0(k)+6*Y(k)+9:M4(k)+4*Y(k)+4$$

Comparison is carried out with respect to a value obtained by a first process.

(3) Selection (Select)

In the case where $M0(k)+6+Y(k)+9<M4(k)+4*Y(k)+4$, $M0(k+1)=M0(k)+6*Y(k)+9$ is obtained.

In the case where $M0(k)+6*Y(k)+9 \geq M4(k)+4*Y$, $M0(k+1)=M4(k)+4*Y(k)+4$ is obtained.

That is, in accordance with a result of a second process (compare), either of the results of the first process (add) is selected.

The above three processes called ACS (Add Compare Select) must be sequentially carried out in the branch metric 31, compare selector 32, and metric register 34 or the like, and becomes a "bottle neck" of a processing speed during a reproducing process of an optical disk apparatus.

(Difference Between Minimum Run Lengths in State Transition Diagram and Trellis Diagram)

In the above-described state transition diagram and trellis diagram, the following difference is shown in decoding (d=1) of a disk modulated in accordance with a modulation rule in a minimum run length is "1" and in decoding (d=2) of a disk modulated in accordance with a modulation rule in which a minimum run length is "2".

FIG. 7 is a state transition diagram in response to (2,7) RLL+PR(1221). A difference from the case of (1,7)RLL of FIG. 6 is that a transition T1 from state S4 to a state 1 and a transition from state S3 to state S6 do not exist.

Figure 9:
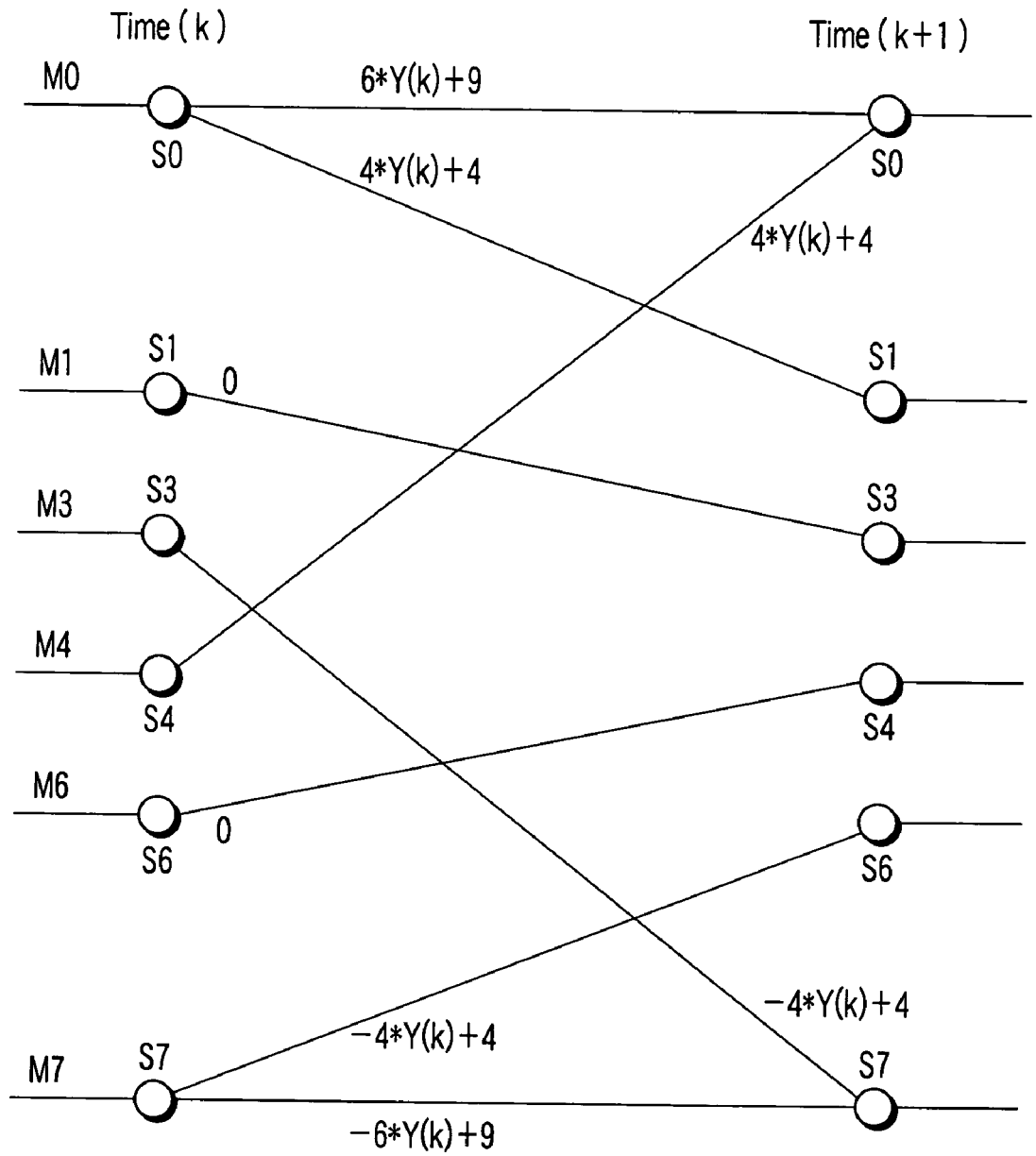
FIG. 9 is a trellis diagram corresponding to (2,7)RLL and PR(1221), which shows a process of the Viterbi decoder of the disk apparatus according to the invention.

FIG. 9 is a trellis diagram in accordance with the state transition diagram of FIG. 7. A (1,7)RLL compatible trellis diagram of FIG. 8 is clearly different from a(2,7)RLL compatible trellis diagram of FIG. 9. In the trellis diagram of FIG. 8, when a pass from S0 to S1 is always selected from among two passes reaching S1, and a pass from S7 to S6 is selected from among two metric values reaching S6, the result is equivalent to the trellis diagram of FIG. 7. In actuality, a pass from S0 is always selected regardless of two metric values reaching S1 at each time, and a pass from S7 is always selected regardless of two metric values reaching S6 at each time. The present invention is applicable to a difference modulation rule using this characteristic.

(Switching Decoding Method by Using Switch at Compare Selector)

That is, in the above-described compare selector 32, in the case of a disk modulated in accordance with a modulation rule in which a minimum run length is "1", the switch 61 selects the comparator 50 in response to the minimum run length selecting signal L, whereby computation is carried out according to the modulation rule in which the run length is "1". On the other hand, in the case of a disk modulated in accordance with a modulation rule in which a minimum run length is "0", the switch 61 selects "0" in response to the minimum run length selecting signal L, computation is carried out in the modulation rule in which the run length is "2". In this manner, the disk modulated in the modulation rule in which the minimum run length is "1" and the disk modulated in the modulation rule in which the minimum run length is "2" are decoded and reproduced by the same Viterbi decoder.

Here, the minimum run length selecting signal L is supplied from the CPU 26 as an example. This signal is provided as an identification signal according to the type of the disk D. That is, as an example, based on reflection light received from the optical pickup 11 (a difference between reflection indexes from disks, for example), an identification signal based on a difference of disk type is generated by the CPU 26. The minimum length selecting signal L according to this identification signal is generated by the CPU 26 or the like, and the generated signal is provided to switches 61 and 62 or the like of the compare selector 32.

Second Embodiment

Figure 10:
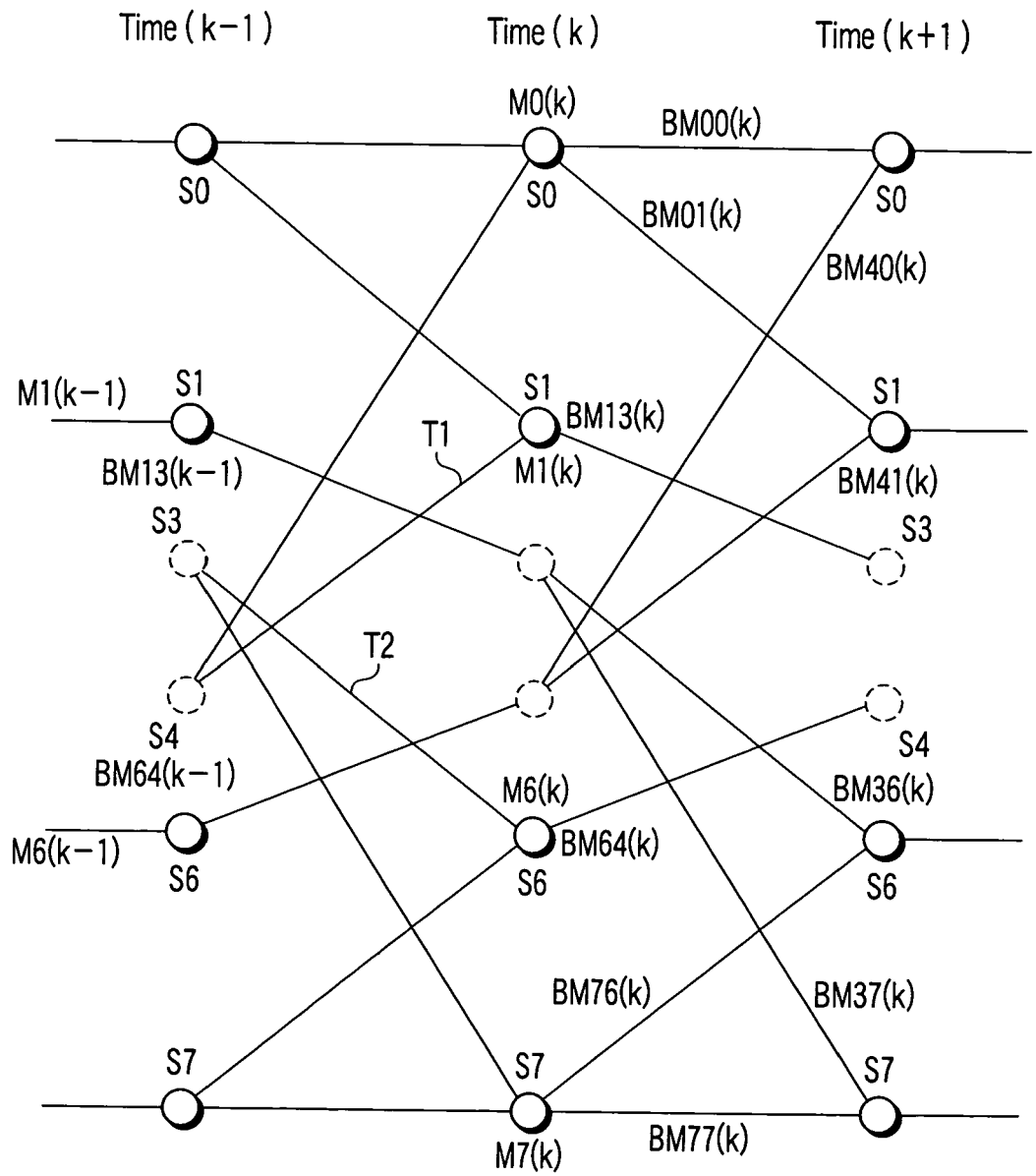
FIG. 10 illustrates a trellis diagram corresponding to (1,7)RLL and PR(1221), which shows a process of a Viterbi decoder of a disk apparatus according to a second embodiment of the present invention.

Now, a second embodiment which simplifies the above-described embodiment will be described here. FIG. 10 is a view showing the trellis diagram shown in FIG. 8 in the range from a time (k−1) to a time (k+1). From this trellis diagram, Formula (4) described previously can be changed as follows.

$$M0(k+1)=\text{Min}\{M0(k)+BM00(k), M6(k-1)+BM64(k-1)+BM40(k)\}$$

$$M1(k+1)=\text{Min}\{M0(k)+BM01(k), M6(k-1)+BM64(k-1)+BM41(k)\}$$

$$M6(k+1)=\text{Min}\{M1(k-1)+M13(k-1)+BM36(k), M7(k)+BM76(k)\}$$

$$M7(k+1)=\text{Min}\{M1(k-1)+M13(k-1)+BM37(k), M7(k)+BM77(k)\} \quad (7)$$

In Formula (7), metrics M(3) and M(4) do not exist. Thus, the compare selector 32 and the metric register 34 can be simplified as compared with those of the first embodiment.

Figure 11:
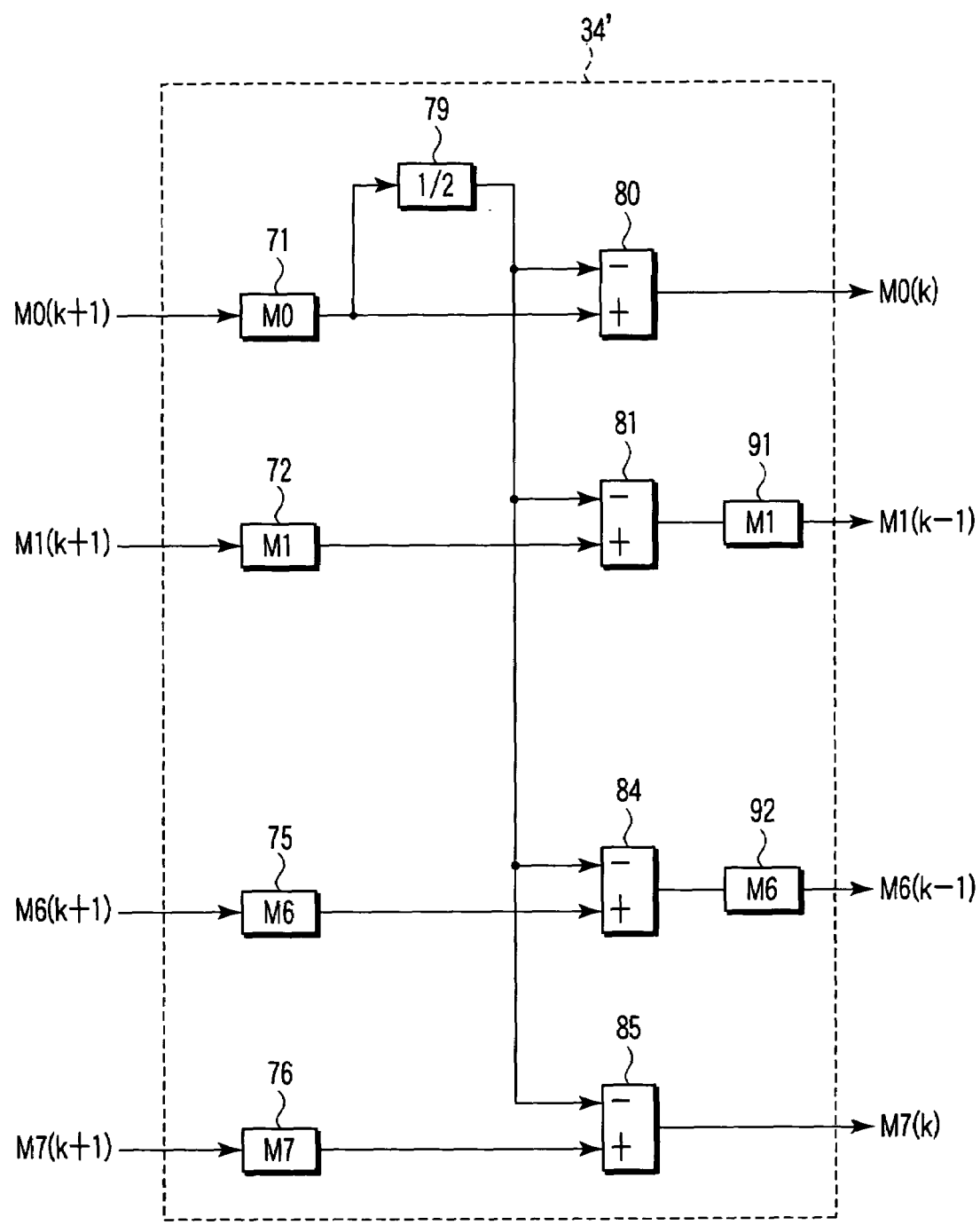
FIG. 11 is a block diagram depicting a configuration of a metric register of the Viterbi decoder of the disk apparatus according to the second embodiment of the invention.

FIG. 11 is a view showing a configuration of the metric register 34 according to the second embodiment. The metric values M0(k+1), M1(k+1), M6(k+1), and M7(k+1) outputted by means of the compare selector 32 in each time are captured by flip flops 161, 162, 165, and 166. A shift circuit 169 obtains a value which is ½ of the value retained by the flip flop 161. Adder circuits 170, 171, 174, and 175 subtract an output value of the shift circuit 169 from the values retained by the flip flops 161, 162, 164, and 165, and obtain a new metric value, thereby preventing an overflow of the metric value. The flip flops 181 and 182 delay the obtained metric values M1(k) and M6(k) by one time, thereby outputting M1(k−1) and M6(k−1) required for comparison of Formula (7).

Figure 12:
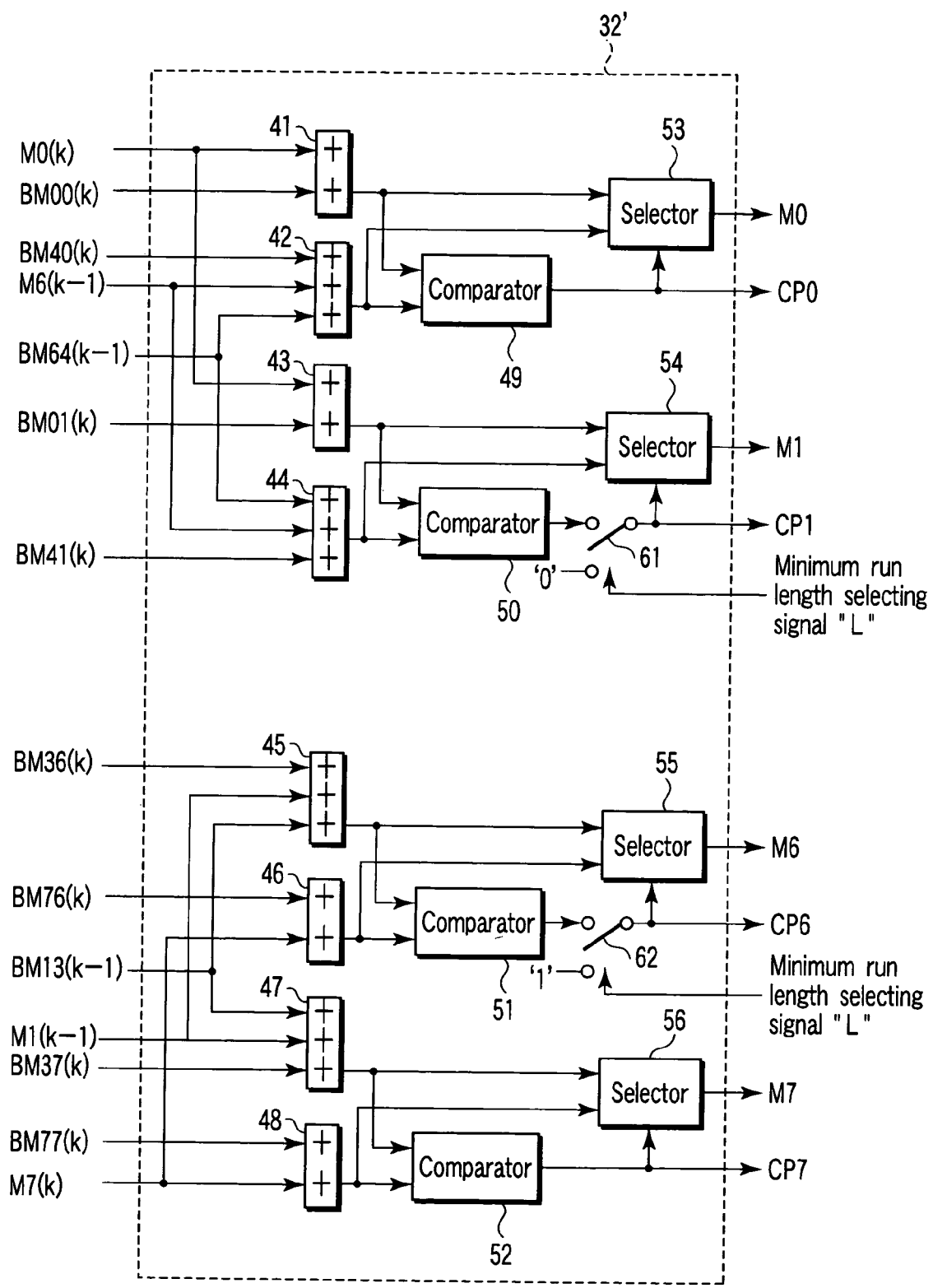
FIG. 12 is a block diagram depicting a configuration of a compare selector of the disk apparatus according to the second embodiment of the invention.

FIG. 12 shows a configuration of a compare selector according to the second embodiment. Here, adding, comparing, and selecting operations of a metric value is carried out in accordance with Formula (7). Difference from the configuration of FIG. 3 are that inputs of metrics M1 and M6 has been deleted; that an input of the adder 132 is produced as M6(k−1)+BM64(k−1)+BM40(k); that an input of the adder 134 is produced as M6(k−1)+BM64(k−1)+BM41(k);

that an input of the adder 135 is produced as M1(k−1)+M13(k−1)+BM36(k); and an input of the adder 137 is produced as M1(k−1)+M13(k−1)+BM37(k). These changes are based on Formula 7 described previously.

As has been described above, according to the present invention, it is possible to inexpensively provide a Viterbi decoder capable of making likelihood estimation in either of a case of a modulation rule in which a minimum run length is "1" and a case of a modulation rule in which a minimum run length is "0". As a result, it is possible to provide a large capacity disk apparatus capable of reproducing a conventional DVD.

As has been described above, according to a disk apparatus of the present invention, it is possible to identify which minimum run length has been used to first modulate a disk in order to reproduce a disk modulated in accordance with a modulation rule in which a minimum run length is "1" and a disk modulated in accordance with a modulation rule in which a minimum run length is "2". Then, when a read signal is decoded by a Viterbi decoder, with respect to the modulation rule in which the minimum run length is "1", a value of probability of a data sequence according to this modulation rule is obtained, and, in comparison with the obtained value, the most probable data sequence is outputted as a reproduction signal. In addition, with respect to the modulation rule in which the minimum run length is "2", a value of probability of a data sequence used only when the minimum run length is "1" is eliminated. Then, only a value of probability of a data sequence in accordance with the modulation rule in which the minimum run length is "2" is compared, and the most probable data sequence is outputted as a reproduction signal.

In this manner, according to the present invention, a disk modulated in accordance with a modulation rule in which a minimum run length is "1" can be reproduced in a Viterbi decoder with the same configuration. On the other hand, it becomes possible to reproduce a disk modulated in accordance with a modulation rule in which a minimum run length is "2", which is a current DVD. Therefore, there can be provided a disk apparatus and a disk reproducing method capable of reduce a configuration to the minimum, reduce a structure, and reduce cost. One skilled in the art can carry out the present invention according to a variety of embodiments described above. Various modifications of these embodiments can be readily conceived by one skilled in the art, and it is possible to apply to a variety of embodiments even if one skilled in the art does not have any inventive capability. Therefore, the present invention encompasses a wide range which does not collide with the disclosed principle and a novel feature, and is not limited to the above described embodiments.

What is claimed is:

1. A disk apparatus comprising:
a reading unit which reads reflection light from a disk and outputs a read signal;
an identifying unit which identifies type of the disk and outputs an identification signal;
an equalizing unit which applies a waveform equalizing process to the read signal outputted by the reading unit; and
a decoding unit which determines whether the read signal according to the identification signal from the identifying unit has been modified in accordance with a first modulation rule or has been modulated in accordance with a second modulation rule, the decoding unit carrying out likelihood decoding of the waveform equalized read signal according to the modulation rule, and outputting a reproduction signal.

2. A disk apparatus according to claim 1, wherein the first modulation rule of the identifying unit is a modulation rule in which a minimum run length is "1", and the second modulation rule is a modulation rule in which a minimum run length is "2".

3. A disk apparatus according to claim 1, wherein the first modulation rule of the identifying unit and the decoding unit each compute values of probabilities with respect to a plurality of data sequences which are candidates of the reproduction signal from the waveform equalized read signal,
when the identification signal indicates the first modulation rule, the most probable data sequence is outputted as the reproduction signal as compared with the values of probabilities of said plurality of data sequences according to the first modulation rule, and
when the identification signal indicates the second modulation rule, the values of probabilities of the data sequences specific to only the first modulation rule are eliminated, and the most probable data sequence is outputted as the reproduction signal as compared with the values of probabilities of said plurality of data sequences in accordance with the second modulation rule.

4. A disk apparatus according to claim 1, wherein the decoding unit provides a switch to, when the identification signal indicates the second modulation rule, eliminate the values of probabilities of the data sequences specific to only the first modulation rule.

5. A disk reproducing method comprising:
reading reflection light from a disk and outputting a read signal;
identifying type of the disk and outputting an identification signal;
applying a waveform equalizing process to the read signal; and
determining whether the read signal according to the identification signal has been modified in accordance with a first modulation rule or has been modulated in accordance with a second modulation rule; and
carrying out likelihood decoding of the waveform equalized read signal according to the modulation rule, and outputting a reproduction signal.

6. A disk reproducing method according to claim 5, wherein the first modulation rule is a modulation rule in which a minimum run length is "1", and the second modulation rule is a modulation rule in which a minimum run length is "2".

7. A disk reproducing method according to claim 5, wherein the first modulation rule and the decoding unit each compute values of probabilities with respect to a plurality of data sequences which are candidates of the reproduction signal from the waveform equalized read signal,
when the identification signal indicates the first modulation rule, the most probable data sequence is outputted as the reproduction signal as compared with the values of probabilities of said plurality of data sequences according to the first modulation rule, and
when the identification signal indicates the second modulation rule, the values of probabilities of the data sequences specific to only the first modulation rule are eliminated, and the most probable data sequence is outputted as the reproduction signal as compared with the values of probabilities of said plurality of data sequences in accordance with the second modulation rule.

* * * * *